United States Patent
Ding et al.

(10) Patent No.: US 9,013,782 B2
(45) Date of Patent: Apr. 21, 2015

(54) LOW-EMISSIVITY PANELS INCLUDING MAGNETIC LAYERS

(71) Applicant: Intermolecular Inc., San Jose, CA (US)

(72) Inventors: Guowen Ding, San Jose, CA (US); Minh Huu Le, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/144,319

(22) Filed: Dec. 30, 2013

(65) Prior Publication Data

US 2014/0268301 A1 Sep. 18, 2014

Related U.S. Application Data

(60) Provisional application No. 61/778,758, filed on Mar. 13, 2013.

(51) Int. Cl.

| | |
|---|---|
| *G02B 26/00* | (2006.01) |
| *C23C 14/08* | (2006.01) |
| *G02F 1/09* | (2006.01) |
| *B29D 11/00* | (2006.01) |
| *G02B 5/26* | (2006.01) |
| *C03C 17/36* | (2006.01) |
| *C23C 14/14* | (2006.01) |

(52) U.S. Cl.
CPC ............ *C23C 14/083* (2013.01); *G02F 1/091* (2013.01); *G02F 2001/094* (2013.01); *Y10T 428/24975* (2015.01); *Y10T 428/265* (2015.01); *B29D 11/00865* (2013.01); *G02B 5/26* (2013.01); *C03C 17/366* (2013.01); *C23C 14/085* (2013.01); *C23C 14/14* (2013.01)

(58) Field of Classification Search
USPC .................................................. 359/290–297
See application file for complete search history.

(56) References Cited

U.S. PATENT DOCUMENTS

2002/0037414 A1 * 3/2002 Cunningham ................ 428/412
2014/0170422 A1 * 6/2014 Wang et al. ................... 428/432

* cited by examiner

Primary Examiner — Mohammed Hasan

(57) ABSTRACT

Disclosed herein are systems, methods, and apparatus for forming low emissivity panels that may include a first substrate. The first substrate may have a first side and a second side. The low emissivity panels may also include a magnetic fluid layer deposited over the first side of the first substrate and a reflective layer deposited over the second side of the first substrate. The magnetic fluid layer may include magnetic particles. The reflective layer may include a conductive material configured to conduct an electrical current and generate a magnetic field. The magnetic field may be configured to change an orientation of the magnetic particles in the magnetic fluid layer and a transmissivity of the magnetic fluid layer within a visible spectrum. The low emissivity panels may also include a first bus and a second bus deposited along opposite edges of the reflective layer and electrically connected to the reflective layer.

20 Claims, 5 Drawing Sheets

LOW-EMISSIVITY PANELS INCLUDING MAGNETIC LAYERS

CROSS-REFERENCE TO RELATED APPLICATIONS

This application claims the benefit under 35 U.S.C. §119 (e) of U.S. Provisional Patent Application 61/778,758, entitled: "Low-E Coatings" filed on 2013 Mar. 13, which is incorporated herein by reference in its entirety for all purposes.

TECHNICAL FIELD

The present disclosure relates generally to low emissivity panels, and more particularly to low emissivity panels including one or more magnetic layers.

BACKGROUND

Sunlight control materials, such as treated glass sheets, are commonly used for building glass windows and vehicle windows. Such materials typically offer high visible transmission and low emissivity thereby allowing more sunlight to pass through the glass window while block infrared (IR) radiation to reduce undesirable interior heating. In low emissivity (low-E) materials, IR radiation is mostly reflected with minimum absorption and emission, thus reducing the heat transferring to and from the low emissivity surface. Low-E panels are often formed by depositing a reflective layer (e.g., silver) onto a substrate, such as glass. The overall quality of the reflective layer is important for achieving the desired performance. In order to provide adhesion, as well as protection, several other layers are typically formed both under and over the reflective layer. These layers typically include dielectric layers, such as silicon nitride, tin oxide, and zinc oxide, which provide protect the stack from both the substrate and the environment. The dielectric layer may also act as optical fillers and function as anti-reflective coating layers to improve the optical characteristics of the panel.

A typical approach to reduce emissivity involves increasing the thickness of the reflective layer (e.g., the silver layer). However, as the thickness of the reflective layer increases, the visible light transmission of this layer is also reduced. Furthermore, the high thickness slows manufacturing throughput and increases costs. It may be desirable to keep the reflective layer as thin as possible, while still providing emissivity suitable for low-e applications.

SUMMARY

Disclosed herein are systems, methods, and apparatus for forming low-emissivity (low-E) panels. In some embodiments, the low emissivity panels may include a first substrate. The first substrate may have a first side and a second side. The low emissivity panels may also include a magnetic fluid layer disposed over the first side of the first substrate and a reflective layer disposed over the second side of the first substrate. The magnetic fluid layer may include magnetic particles. The reflective layer may include a conductive material configured to conduct an electrical current and generate a magnetic field. The magnetic field may be configured to change an orientation of the magnetic particles in the magnetic fluid layer and a transmissivity of the magnetic fluid layer within a visible spectrum. The low emissivity panels may further include a first bus and a second bus. The first bus and the second bus may be deposited along opposite edges of the reflective layer and electrically connected to the reflective layer. In some embodiments, applying a voltage between the first bus and the second bus generates the electrical current through the reflective layer.

In some embodiments, a conductive material of the reflective layer includes one of silver or aluminum. The reflective layer may have a thickness of between about 10 nm and 40 nm. In some embodiments, the first substrate may include glass having a thickness of between about 1 mm and 10 mm.

The low emissivity panels may further include a second substrate. The magnetic fluid layer may be disposed between the first substrate and the second substrate. The second substrate may be attached to the first substrate along edges of the first substrate and the second substrate. In some embodiments, the magnetic particles of the magnetic fluid layer may include one of magnetite or hematite. The magnetic particles may include a surfactant, where the surfactant is one of oleic acid, tetra-methyl ammonium hydroxide, citric acid, or soy lecithin. In some embodiments, the magnetic fluid layer is formed by a plurality of capsules. Each of the plurality of capsules includes a portion of the magnetic particles suspended in a carrier fluid. The plurality of capsules may be adhered to the first side of the first substrate.

In some embodiments, the low emissivity panels may be configured to change transmissivity by at least about 25% when the current is passed through the reflective layer. Furthermore, the low emissivity panels may be configured to apply different voltages at different locations along opposite edges of the reflective layer.

Also disclosed herein are methods of operating low emissivity panels. The methods may include providing low emissivity panels that include a first substrate, a magnetic fluid layer formed on a first surface of the first substrate, and a reflective layer formed on a second surface of the first substrate. The magnetic fluid layer may include magnetic particles. The reflective layer may include a conductive material. The methods may further include applying a first voltage to the reflective layer between two opposite edges of the reflective layer. In some embodiments, applying the first voltage changes a transparency of the low emissivity panel.

In some embodiments, applying the first voltage generates an electrical current through the reflective layer and creates a magnetic field. The magnetic field may change an orientation of the magnetic particles in the magnetic fluid layer. The change in the orientation of the magnetic particles in the magnetic fluid layer may change a transmissivity of the magnetic fluid layer within a visible spectrum. In some embodiments, applying the first voltage to the reflective layer changes a transmissivity of the low emissivity panels by at least 25%.

In some embodiments, the methods may further include applying a second voltage to the reflective layer. Applying the second voltage may further change the transmissivity of the low emissivity panels. The second voltage may be about 0 V and the transmissivity of the low emissivity panels may return to an original state in response to the application of the second voltage. In some embodiments, the second voltage may have a reverse polarity relative to the first voltage. Applying the second voltage may change a transmissivity of the low emissivity panels in a different wavelength region relative to applying to the first voltage. In some embodiments, a current density passed through the reflective layer may range from between about 0.1 mA/µm² and 10 mA/µm².

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Some embodiments can readily be understood by considering the following detailed description in conjunction with the accompanying drawings, in which.

DETAILED DESCRIPTION OF EXAMPLE EMBODIMENTS

Figure 1:
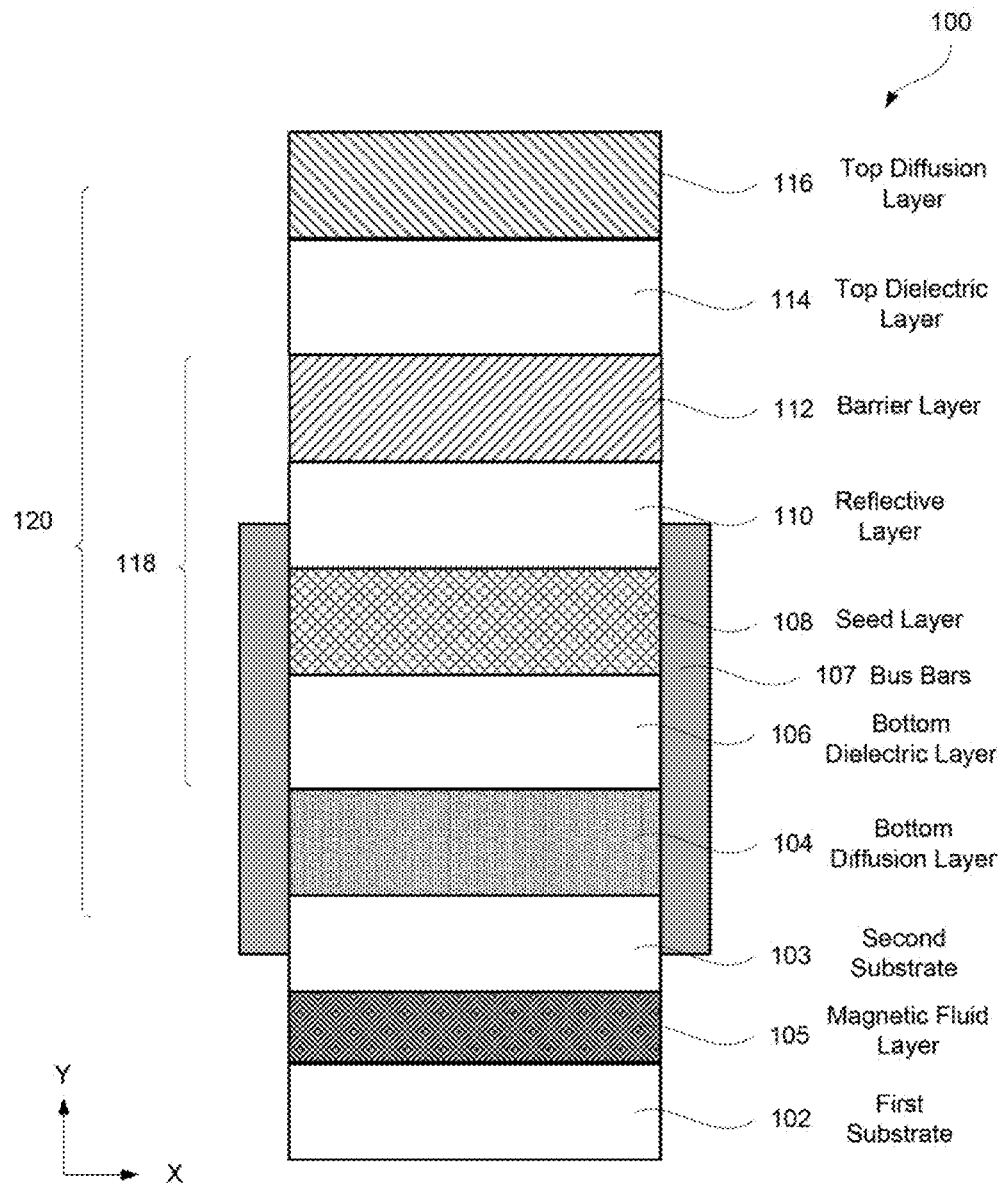
FIG. 1 is a schematic illustration of an article including a substrate and a stack of layers including one reflective layer formed over the substrate, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Disclosed herein are low emissivity panels having an adjustable transmissivity of visible light. Further disclosed herein are methods of operating such panels. Low emissivity panels may include a magnetic fluid deposited between two substrates, such as two sheets of glass. One of the substrates may support a stack of layers including a reflective layer that may be formed from a conductive material. For example, one side of the substrate may be in contact with the magnetic fluid, while another side of the same substrate may support a low emissivity stack including a reflective layer. Other layers of the low emissivity stack may include one or more diffusion layers, one or more dielectric layers, a seed layer, and a barrier layer.

The reflective layer of the low emissivity panels may be electrically coupled to leads that are used to apply a voltage to the reflective layer. As similarly stated above, the reflective layer may be made from a conductive material, such as aluminum or silver, and the applied voltage may generate a current that passes or flows through the reflective layer. The passage of the current through the reflective layer generates a magnetic field which is applied to the magnetic fluid and affects the magnetic fluid or, more specifically, changes an orientation of magnetic particles included in the magnetic fluid. This change in orientation of the magnetic particles may be configured to change a transmissivity of the magnetic fluid and an overall transmissivity of the low emissivity panels.

The process of changing a transmissivity of the low emissivity panels is reversible such that when no voltage is applied to the reflective layer (e.g., the reflective layer is disconnected from a voltage source), the orientation of the magnetic particles in the magnetic fluid returns to its original state due to the van der Waals forces. The particles may be coated with a surfactant to stimulate this reversion of the orientation of the magnetic particles to their original state. As the magnetic particles revert to their original orientation, the transmissivity of the low emissivity panels also reverts to their original transmissivity. In some embodiments, a reverse current may be applied to the reflective layer in order to expedite or facilitate the process of returning the low emissivity panels to their original state. The original state, which may be defined as a state when no external voltage is applied to the reflective layer, may correspond to the most transmissive state of the low emissivity panels. In this example, the transmissivity of the low emissivity panels may be decreased relative to their original state when one or more voltages are applied to the reflective layer. Alternatively, the transmissivity of the low emissivity panels in their original state may be increased or decreased based on, for example, the direction of the electrical current through the reflective layer and the orientation of the magnetic fields generated based on those currents. Thus, the transmission characteristics of the low emissivity panels may be variable depending on the voltage applied to a reflective layer. Furthermore, the transmission characteristics may be tuned to a specific wavelength range.

In some embodiments, the low emissivity panels may include two bus bars extending along the opposite edges of the second substrate, which may be a sheet of glass. Each bus bar may be electrically coupled to the reflective layer. For example, a portion of the reflective layer may be formed or coated over portions of the bus bars thereby creating overlaps between the reflective layer and the bus bars. The bus bars may be made from a conductive material and provide uniform application of the voltage along the entire edges of the low emissivity panels. Alternatively, the bus bars may be made from a resistive material such that the voltage applied to the reflective layer gradually changes along the edges of the low emissivity panels. This variation in voltage may be used to provide gradual change in a transmissivity of the low emissivity panels. For example, low emissivity panels may be changed into a state in which the top of the low emissivity panels that is facing or is closer to the sun is less transmissive, and the bottom of the low emissivity panels that is facing or is closer to the ground is more transmissive. In some embodiments, a voltage is applied to the reflective layer by multiple individual structures deposited along opposite edges of the low emissivity panels, such that each pair of the structures may operate at a different voltage from one or more of the other pairs.

The magnetic particles in the magnetic fluid may be suspended in a carrier fluid, such as an organic solvent or water. Thus, the magnetic fluid may be a colloidal suspension. The particles may be coated with a surfactant to inhibit clumping and enable the reversible nature of the particle orientation. Some examples of suitable surfactants include oleic acid, tetra-methyl ammonium hydroxide, citric acid, and soy lecithin. The magnetic particles may be made of magnetite, hematite, or some other compound containing iron. The magnetic particles may be between about 1 and 20 nanometers in size. The particles are small enough for thermal agitation to disperse them evenly within a carrier fluid, and for them to contribute to the overall magnetic response of the fluid. The magnetic fluid may include between about 1% and 10% by volume of the magnetic particles, and between about 5% and 20% by volume of the surfactant. The remainder of the magnetic fluid may be the carrier fluid. The composition of the magnetic fluid and its thickness in the low emissivity panels may be used to configure a transmissivity of the low emissivity panels.

In some embodiments, a magnetic fluid is in the form of capsules, where each capsule contains magnetic particles. The capsules may be a few microns in size and may be adhered directly to a substrate or, for example, to the top diffusion layer of the low emissivity stack. In some embodiments, the use of capsules allows the low emissivity panels to be cut after fabrication.

Examples of Low-Emissivity Coatings

A brief description of low-E coatings is provided for context and better understanding of various features associated with magnetic layers, barrier layers, and silver reflective layers. One having ordinary skill in the art would understand that these layers may be also used for other applications, such as light emitting diodes (LED), reflectors, and other like applications. Some characteristics of low-E coatings are applicable to these other applications as well. For purposes of this disclosure, low-E is a quality of a surface that emits low levels of radiant thermal energy. Emissivity is the value given to materials based on the ratio of heat emitted compared to a blackbody, on a scale of 0 (for a perfect reflector) to 1 (for a back body). The emissivity of a polished silver surface may be less than 0.01. Reflectivity is inversely related to emissivity. When values of reflectivity and emissivity are added together, their total is equal 1.

FIG. 1 is a schematic illustration of an article 100 including first substrate 102, second substrate 103, magnetic fluid layer 105, and a stack 120 of layers 104-116, in accordance with some embodiments. Specifically, stack 120 includes one reflective layer 110 formed over second substrate 103 and protected by a barrier layer 112. Other layers in stack 120 may include bottom diffusion layer 104, top diffusion layer 116, bottom dielectric layer 106, top dielectric layer 114, and seed layer 108. Each one of these components will now be described in more details. One having ordinary skills in the art would understand that the stack may include fewer layers or more layers as, for example, described below with reference to FIG. 2 and FIG. 3.

Article 100 may include first substrate 102 which may be made of any suitable material. First substrate 102 may be opaque, translucent, or transparent to the visible light. For example, for low-E applications, the substrate may be transparent. Specifically, a transparent glass substrate may be used for this and other applications. For purposes of this disclosure, the term "transparency" is defined as a substrate characteristic related to a visible light transmittance through the substrate. The term "translucent" is defined as a property of passing visible light through the substrate and diffusing this energy within the substrate, such that an object positioned on one side of the substrate is not visible on the other side of the substrate. The term "opaque" is defined as a visible light transmittance of 0%. Some examples of suitable materials for first substrate 102 include, but are not limited to, plastic substrates, such as acrylic polymers (e.g., polyacrylates, polyalkyl methacrylates, including polymethyl methacrylates, polyethyl methacrylates, polypropyl methacrylates, and the like), polyurethanes, polycarbonates, polyalkyl terephthalates (e.g., polyethylene terephthalate (PET), polypropylene terephthalates, polybutylene terephthalates, and the like), polysiloxane containing polymers, copolymers of any monomers for preparing these, or any mixtures thereof.

First substrate 102 may be also made from one or more metals, such as galvanized steel, stainless steel, and aluminum. Other examples of substrate materials include ceramics, glass, and various mixtures or combinations of any of the above.

Article 100 may also include second substrate 103 which may be made of any of the suitable materials discussed above with reference to first substrate 102. As similarly discussed above with reference to first substrate 102, second substrate 103 may be opaque, translucent, or transparent to the visible light. In some embodiments, second substrate 103 may have two sides or faces. A first face of second substrate 103 may provide structural support for a stack of layers used in a low-E stack, such as stack 120. A second face of second substrate 103 may be in contact with magnetic fluid included in a magnetic fluid layer, such as magnetic fluid layer 105 discussed in greater detail below. Thus, the second face of second substrate 103 may define a portion of a space or cavity used to contain a magnetic fluid that may be included in magnetic fluid layer 105. In some embodiments, first substrate 102 and second substrate 103 may have a thickness between about 1 mm and 10 mm.

Article 100 may further include magnetic fluid layer 105. In some embodiments, magnetic fluid layer 105 may be configured to change one or more optical characteristics, such as transmissivity, in response to the presence or absence of a magnetic field. In some embodiments, magnetic fluid included in magnetic fluid layer 105 may include particles having a configuration or geometry that transmits more visible light in a first orientation and transmits less visible light in a second orientation. The application of a magnetic field to the magnetic particles included in the magnetic fluid may cause the magnetic particles to change orientations, thus changing the transmissivity of the magnetic fluid. Accordingly, as discussed in greater detail below, a transmissivity of the low-E panel as a whole may be changed or varied by applying a magnetic field to the magnetic particles included in magnetic fluid layer 105. In some embodiments, magnetic fluid layer 105 may be formed or positioned between first substrate 102 and second substrate 103. For example, first substrate 102 and second substrate 103 may be separated by a designated space or distance to create a space or cavity between first substrate 102 and second substrate 103. First substrate 102 and second substrate 103 may be sealed along their respective edges, such that the space or cavity between them is sealed to create an enclosed space. The enclosed space between first substrate 102 and second substrate 103 may be filled with a magnetic fluid which is operable as magnetic fluid layer 105.

As similarly discussed above, the application of one or more magnetic fields to magnetic fluid included in magnetic fluid layer 105 may change one or more optical transmission characteristics of magnetic fluid layer 105 and article 100. In some embodiments, the magnetic field may be generated based on the application of a voltage to a conductive material that passes a current through the conductive material. As discussed in greater detail below, the conductive material may be a layer in article 100, such as reflective layer 110. In some embodiments, reflective layer 110 may be made of a conductive material, such as silver, and may be electrically coupled to one or more leads that may be coupled to a voltage source which may be external to article 100. The voltage source may be configured to apply a voltage to reflective layer 110 to generate a current that passes through reflective layer 110. The passage of the current through reflective layer 110 may generate a magnetic field in an area adjacent to reflective layer 110. In some embodiments, the current passed through reflective layer 110 may have a current density of between about 0.1 mA/μm² and 10 mA/μm². In some embodiments, magnetic fluid layer 105 may be positioned close enough to reflective layer 110 to be within the magnetic field generated by the current passed through reflective layer 110. As similarly discussed above, the magnetic field generated by reflective layer 110 may affect or change an orientation of magnetic particles included in magnetic fluid layer 105 and consequently change a transmissivity of magnetic fluid layer 105 and article 100. For example, when a voltage is applied to bus bars 107 and a current is passed through reflective layer 110, a transmissivity of the low emissivity panel may change by at least 25%.

In some embodiments, electrical leads may be bus bars, such as bus bars 107. Accordingly, article 100 may include bus bars 107 which may extend along opposite edges of article 100 and the low-E panel that includes article 100. In some embodiments, each bus bar of bus bars 107 may be electrically coupled to reflective layer 110. For example, a portion of reflective layer 110 may be formed or coated over portions of bus bars 107 thereby creating one or more overlapping regions in which reflective layer 110 is formed over a bus bar and is in direct contact with the bus bar. In some embodiments, bus bars 107 may be made from a conductive material and provide uniform application of the voltage along the entire edges of the low emissivity panels. Alternatively, bus bars 107 may be made from a resistive material. Due to the resistance of the material included in bus bars 107, the amplitude of the voltage along each bus bar may gradually change along the length the bus bar. When configured in this way, the variation in the amplitude of the voltage along bus bars 107 may provide a gradual change in a transmissivity of the low emissivity panels. For example, upon the application of a voltage to a conductive material in article 100, such as reflective layer 110, the low emissivity panels may be changed into a state in which the top of the low emissivity panels that is facing or is closer to the sun is less transmissive, and the bottom of the low emissivity panels that is facing or is closer to the ground is more transmissive.

In some embodiments, a voltage is applied to reflective layer 110 by multiple individual structures deposited along opposite edges of the low emissivity panels, such that each pair of the structures may operate at a different voltage from one or more of the other pairs. In some embodiments, the individual structures may be additional bus bars that are each coupled to reflective layer 110. Accordingly, when configured in this way, bus bars 107 do not run along an entire side of article 100 and the low-E panel that includes article 100. Instead, the low-E panel may include multiple pairs of bus bars which may each be operated independently at different or the same voltages. In this way, a plurality of structures, which may be bus bars, may be used to apply different voltages to reflective layer 110 to generate a gradient in the transmissivity of magnetic fluid layer 105 and article 100.

In some embodiments, changes in a transmissivity of the low emissivity panels are not permanent and may be reversible. For example, when no voltage is applied to reflective layer 110 via bus bars 107, the orientation of the magnetic particles included in the magnetic fluid of magnetic fluid layer 105 returns to their original position or state. The original state, which may be defined as a resting state of the magnetic particles included in the magnetic fluid, may be a state in which no external voltage is applied to reflective layer 110. The original state may also be the most transmissive state of magnetic fluid layer 105, article 100, and the low emissivity panel that includes article 100. In some embodiments, a transmissivity of a low emissivity panel may be decreased relative to its original state when one or more voltages are applied to reflective layer 110. Moreover, the transmissivity of the low emissivity panel in its original state may be increased or decreased based on, for example, the direction of an electrical current passed through reflective layer 110 and the orientation of the magnetic fields generated based on those currents. For example, a first current passed in a first direction based on a first voltage having a first polarity may decrease a transmissivity of magnetic fluid layer 105. Moreover, a second current passed in a second direction based on a second voltage having a second polarity may increase a transmissivity of magnetic fluid layer 105. Thus, the transmission characteristics of the low emissivity panels may be varied based on an amplitude and polarity of a voltage applied to reflective layer 110. Furthermore, the transmission characteristics of the low emissivity panels may be tuned to a specific wavelength range. In some embodiments, a first voltage may cause a change in transmissivity in a first wavelength region while a second voltage causes a change in a second wavelength region that is different than the first wavelength region.

In some embodiments, the reversion of the transmissivity of magnetic fluid layer 105 from a changed stated to an original or resting state may be due to Van der Waals forces between the magnetic particles. Thus, attractive and/or repulsive forces between the magnetic particles may cause the magnetic particles to return to their original resting state when a voltage is no longer applied to reflective layer 110. In some embodiments, the particles may be coated with a surfactant to inhibit clumping and facilitate the reversion of the orientation of the magnetic particles to their original state, as discussed in greater detail below. As the magnetic particles revert to their original orientation, the low emissivity panels also revert to their original transmissivity. In some embodiments, a reverse current may be applied to reflective layer 110 in order to expedite or facilitate the process of returning the low emissivity panels to their original state. Thus, subsequent to the application of a first voltage to reflective layer 110 that was used to change a transmissivity of magnetic fluid layer 105, a second voltage opposite to the first voltage may be briefly applied to reverse the change in transmissivity and facilitate the return of the magnetic particles to their original state.

In some embodiments, the magnetic particles in the magnetic fluid of magnetic fluid layer 105 may be suspended in a carrier fluid, such as an organic solvent or water. Thus, the magnetic fluid may be a colloidal suspension. As similarly discussed above, the magnetic particles may be coated with a surfactant to inhibit clumping and enable the reversible nature of the particle orientation. Examples of suitable surfactants may include oleic acid, tetra-methyl ammonium hydroxide, citric acid, and soy lecithin. The magnetic particles may be made of magnetite, hematite, or some other compound containing iron. In some embodiments, the magnetic particles may be between about 1 and 20 nanometers in size. Thus, the magnetic particles may be small enough for thermal agitation to disperse them evenly within a carrier fluid, and for the magnetic particles to contribute to the overall magnetic response of the magnetic fluid. The magnetic fluid may include between about 1% and 10% by volume of the magnetic particles, and between about 5% and 20% by volume of the surfactant. The remainder of the magnetic fluid may be the carrier fluid. The composition of the magnetic fluid and its thickness or viscosity may be used to configure a transmissivity of the low emissivity panels or one or more characteristics of a change in transmissivity of the low emissivity panels, such as a speed of the change in transmissivity. For example, a magnetic fluid with a higher viscosity may take longer for magnetic particles to align with a magnetic field and may change transmissivity more slowly than a magnetic fluid with a lower viscosity.

In some embodiments, the magnetic fluid included in magnetic fluid layer 105 included in a plurality of capsules. A capsule may be a container configured to store or retain an amount of magnetic fluid. Accordingly, each capsule included in magnetic fluid layer 105 may include magnetic particles. In some embodiments, the magnetic particles included in each capsule are suspended in a carrier fluid, as similarly discussed above. Thus, each capsule may encapsulate an amount of the magnetic fluid described above. The capsules may be a few microns in size and may be adhered directly to first substrate 102 or second substrate 103. In some embodiments, the capsules may be adhered to or included in any other layer included in article 100. For example, the capsules may be adhered to a surface of top diffusion layer 116. In this example, article 100 might not include magnetic fluid layer 105 and first substrate 102, but instead might include a layer of capsules adhered to a top surface of top diffusion layer 116. In some embodiments, the use of capsules allows the low emissivity panels to be cut after fabrication because the magnetic fluid is encapsulated within the capsules and will not spill if one or more substrates are cut. It will be appreciated that one or more conventional methods may be used to electrically couple a voltage source to the low emissivity panels after being cut. For example, electrical connection legs may be coupled to one or more edges of the low emissivity panels.

As discussed above, article 100 may further include a low-E stack, such as stack 120, that is formed on second substrate 103. Accordingly, article 100 may include bottom diffusion layer 104 and top diffusion layer 116 which may be two layers of stack 120 that protect the entire stack 120 from the environment and improve chemical and/or mechanical durability of stack 120. Diffusion layers 104 and 116 may be made from the same or different materials and may have the same or different thickness. In some embodiments, one or both diffusion layers 104 and 116 are formed from silicon nitride. In some embodiments, silicon nitride may be doped with aluminum and/or zirconium. The dopant concentration may be between about 0% to 20% by weight. In some embodiments, silicon nitride may be partially oxidized. Silicon nitride diffusion layers may be silicon-rich, such that their compositions may be represented by the following expression, $Si_xN_y$, where the X-to-Y ratio is between about 0.8 and 1.0. The refraction index of one or both diffusion layers 104 and 116 may be between about 2.0 and 2.5 or, more specifically, between about 2.00 to 2.25. The thickness of one or both diffusion layers 104 and 116 may be between about 50 Angstroms and 300 Angstroms or, more specifically, between about 100 Angstroms and 200 Angstroms.

In addition to protecting stack 120 from the environment, bottom diffusion layer 104 may help with adhering bottom dielectric layer 106 to second substrate 103. Without being restricted to any particular theory, it is believed that deposition of dielectric layer 106 and in particular subsequent heat treatment of this layer results in heat-induced mechanical stresses at the interfaces of dielectric layer 106. These stresses may cause delamination of dielectric layer 106 from other layers and coating failure. A particular example is a titanium oxide layer deposited directly onto the glass substrate. However, when silicon nitride diffusion layer 104 is provided between bottom dielectric layer 106 and second substrate 103, the adhesion within this three-layer stack remains strong as evidenced by improved durability, especially after heat treatment.

Typically, each reflective layer provided in a stack is surrounded by two dielectric layers, e.g., bottom dielectric layer 106 and top dielectric layer 114 as shown in FIG. 1. Dielectric layers 106 and 114 are used to control reflection characteristics of reflective layer 110 as well as overall transparency and color of stack 120 and, in some embodiments, of article 100. Dielectric layers 106 and 114 may be made from the same or different materials and may have the same or different thickness. In some embodiments, one or both dielectric layers 106 and 114 are formed from $TiO_2$, ZnO, $SnO_2$, SiAlN, or ZnSn. In general, dielectric layers 106 and 114 may be formed from various oxides, stannates, nitrides, and/or oxynitrides. In some embodiments, one or both dielectric layers 106 and 114 may include dopants, such as Al, Ga, In, Mg, Ca, Sr, Sb, Bi, Ti, V, Y, Zr, Nb, Hf, or Ta. Dielectric layers 106 and 114 can each include different dielectric materials with similar refractive indices or different materials with different refractive indices. The relative thicknesses of the dielectric films can be varied to optimize thermal-management performance, aesthetics, and/or durability of article 100.

The materials of dielectric layers 106 and 114 may be in amorphous phases, crystalline phases, or a combination of two or more phases. In some embodiments, a dielectric layer may be, at least in part, amorphous. A material may be a substantially amorphous material if the crystalline phase composes less than 5% of the material by volume. Accordingly, dielectric layer 106 and dielectric layer 114 may each be substantially amorphous. For example, when stack 120 includes seed layer 108, bottom dielectric layer 106 may be substantially amorphous. Alternatively, when stack 120 does not include seed layer 108, bottom dielectric layer 106 may be in a crystalline phase (e.g. greater than 30% crystalline as determined by X-ray diffraction) and may function as a nucleation template for overlying layers, e.g., reflective layer 110. The thickness of dielectric layers 106 and 114 may be between about 50 Angstroms and 1000 Angstroms or, more specifically, between 100 Angstroms and 300 Angstroms.

In some embodiments, stack 120 includes seed layer 108. Seed layer 108 may be formed from ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. In some embodiments, the material of seed layer 108 may be in a crystalline phase. Seed layer 108 may function as a nucleation template for overlying layers, e.g., reflective layer 110. In some embodiments, the thickness of seed layer 108 is between about 100 Angstroms and 400 Angstroms, such as about 300 Angstroms.

Stack 120 includes reflective layer 110, which may be formed from a highly reflective material such as silver. The thickness of reflective layer 110 may be between about 100 Angstroms and 400 Angstroms or, more specifically, between about 200 Angstroms and 300 Angstroms.

As noted above, stack 120 also includes barrier layer 112 to protect reflective layer 110 from oxidation and other damage. In some embodiments, barrier layer 112 may be formed from a partially oxidized alloy of at least nickel, titanium, and niobium. In some embodiments, a partially oxidized alloy may be an alloy or metals in which one or more metals included in the alloy have sub-stoichiometric oxidation. Barrier layer 112 may be formed from a quaternary alloy that includes nickel, chromium, titanium, and aluminum. The concentration of each metal in this alloy is selected to provide adequate transparency and oxygen diffusion blocking properties. In some embodiments, a combined concentration of nickel and chromium in the barrier layer is between about 20% by weight and 50% by weight or, more specifically, between about 30% by weight and 40% by weight. A weight ratio of nickel to chromium in the alloy may be between about 3 and 5 or, more specifically, about 4. A weight ratio of titanium to aluminum is between about 0.5 and 2, or more, specifically about 1. In some embodiments, the concentration of nickel in the barrier layer is between about 5% and 10% by weight, the concentration of chromium—between about 25% and 30% by weight, the concentration of titanium and aluminum—between about 30% and 35% by weight each. This composition of barrier layer 112 may be achieved by using one or more sputtering target containing nickel, chromium, titanium, and aluminum, controlling concentration of these metals in the sputtering targets, and controlling power levels applied to each sputtering target. For example, two sputtering targets may be used. The first target may include nickel and chromium, while the second target may include titanium and aluminum. The weight ratio of nickel to chromium in the first target may be about 4, while the weight ratio of titanium to aluminum in the second target may be about 1. These weight ratios may be achieved by using corresponding alloys for the entire target, target inserts made from different materials, or other features allowing combination of two or more materials in the same target. The two targets may be exposed to different power levels. In the above example, the first target may be exposed to twice smaller power than the second target to achieve the desired composition. The barrier can be deposited substantially free of oxygen (e.g., predominantly as a metal) in the inert environment (e.g., argon environment). Alternatively, some oxidant (e.g., 15% by volume of O2 in Ar) may be used to oxide the four metals. The concentration of oxygen in the resulting barrier layer may be between about 0% and 5% by weight.

In some embodiments, nickel, chromium, titanium, and aluminum are all uniformly distributed throughout the barrier layer, i.e., its entire thickness and coverage area. Alternatively, the distribution of components may be non-uniform. For example, nickel and chromium may be more concentrated along one interface than along another interface. In some embodiments, a portion of the barrier layer near the interface with the reflective layer includes more nickel for better adhesion to the reflective layer. In some embodiments, substantially no other components other than nickel, chromium, titanium, and aluminum are present in barrier layer 112.

As stated above, barrier layer 112 may include a material that is an alloy of several metals. For example, barrier layer 112 may be a layer of a material, such as NiTiNb which may be configured to have a thickness between about 1.5 nm and 5 nm. In one example, barrier layer 112 has a thickness of 2.4 nm. Barrier layer 112 may be formed using a deposition technique, such as sputtering. During the forming process, a small amount of oxygen may be mixed with Argon to create a layer of NiTiNb oxide having an oxygen content between 10% to 30% by atomic weight. In some embodiments, barrier layer 112 may have a thickness of between about 1 Angstrom and 100 Angstroms or, more specifically, between about 5 Angstroms and 30 Angstroms, and even between about 10 Angstroms and 20 Angstroms.

Without being restricted to any particular theory, it is believed that when the barrier layer is exposed to oxygen (e.g., during deposition of the top dielectric), some metals of the barrier layer (e.g., Cr, Ti, and Al) will be easily oxidized thereby consuming oxygen and preventing oxygen from penetrating through the barrier layer and reaching the reflective layer. As such, the barrier layer may be considered as a scavenging layer.

Top diffusion layer 116 may be similar to bottom diffusion layer 104 described above. In some embodiments, top diffusion layer 116 (e.g., formed from silicon nitride) may be more stoichiometric than bottom diffusion layer 104 to give better mechanical durability and give a smoother surface. Bottom diffusion layer 104 (e.g., formed from silicon nitride) can be silicon-rich to make film denser for better diffusion effect.

The overall stack 120 may have a sheet resistance of between about 6 Ohm/square to 8 Ohm/square when a silver reflective layer has a thickness between 80 Angstroms and 90 Angstroms. The sheet resistance of stack 120 may be between about 0.5 Ohm/square to 2 Ohm/square for a thickness of a silver reflective layer between 150 Angstroms and 400 Angstroms.

In some embodiments, a stack may include multiple reflective layers in order to achieve a specific performance. For example, the stack may include two, three, or more reflective layers. The multiple reflective layers may have the same or different composition and/or thicknesses. Each new reflective layer may have a corresponding dielectric layer (e.g., at least one layer formed in between two reflective layers), a seed layer, and a barrier layer. FIG. 1 illustrates a portion 118 of stack 120 that may be repeated. Stack portion includes dielectric layer 106 (or dielectric layer 114), seed layer 108, reflective layer 110, and barrier layer 112. In some embodiments, portion 118 may not include seed layer 108.

Figure 2:
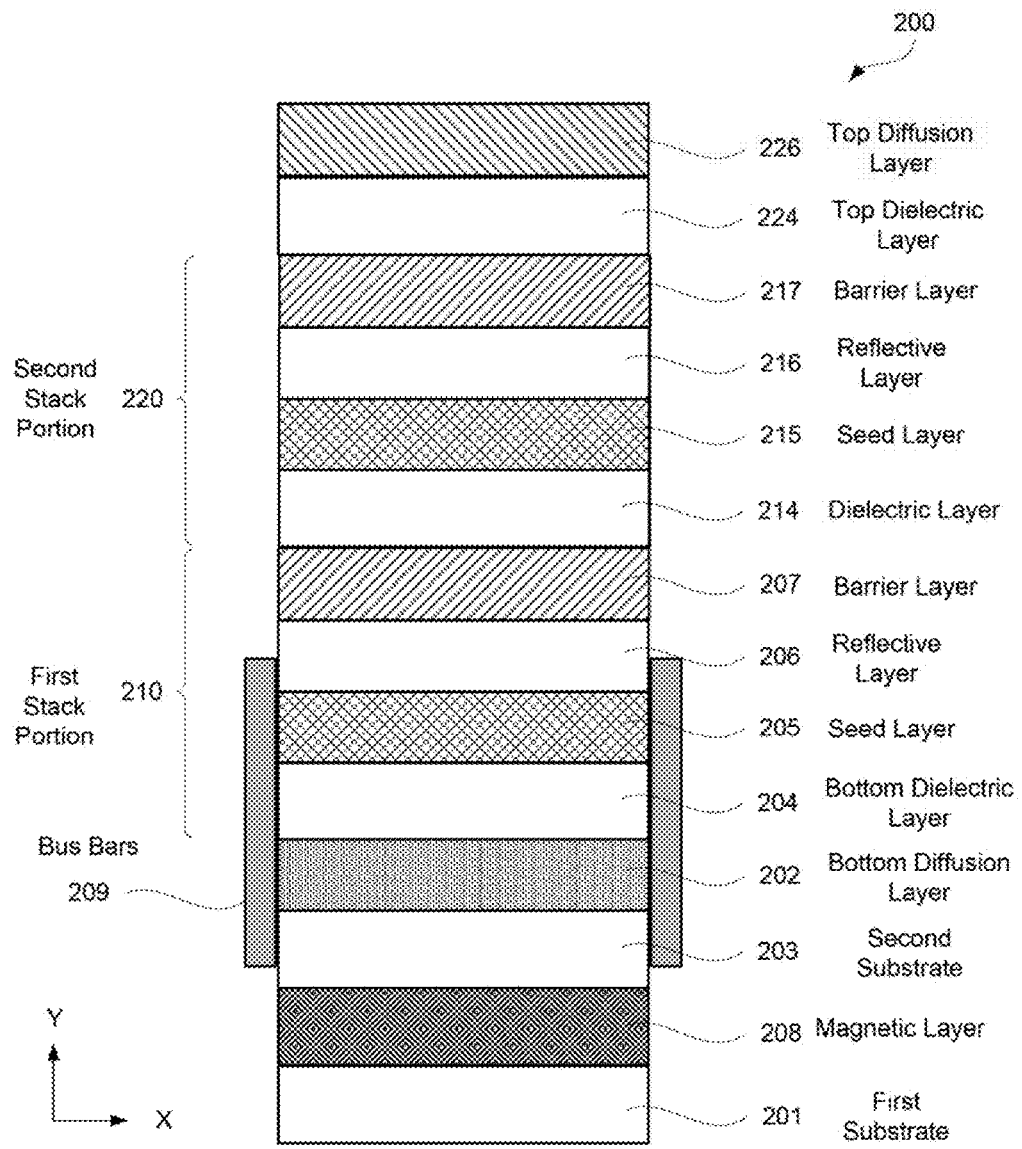
FIG. 2 is a schematic illustration of another article including a substrate and a stack of layers including two reflective layers formed over the substrate, in accordance with some embodiments.

FIG. 2 is a schematic illustration of another article 200 including first substrate 201, second substrate 203, magnetic layer 208, bus bars 209, and a stack including two reflective layers 206 and 216, in accordance with some embodiments. Each one of reflective layers 206 and 216 is a part of a separate stack portion that includes other layers, i.e., reflective layer 206 is a part of first stack portion 210, while reflective layer 216 is a part of second stack portion 220. Other layers in first stack portion 210 include dielectric layer 204, seed layer 205, and barrier layer 207. Likewise, in addition to reflective layer 216, second stack portion 220 includes dielectric layer 214, seed layer 215, and barrier layer 217. It should be noted that reflective layers 206 and 216 are separated by only one dielectric layer 214. The overall article 200 also includes bottom diffusion layer 202, top dielectric layer 224, and top diffusion layer 226. As similarly discussed above with reference to FIG. 1, a reflective layer, such as reflective layer 206, may include silver. Moreover, a seed layer may include a metal oxide, as previously discussed with reference to seed layer 108 of FIG. 1, such as zinc oxide, titanium oxide, or tin oxide. A barrier layer may include a partially oxidized alloy of at least nickel, titanium, and niobium. Furthermore a dielectric layer may include $TiO_2$, ZnO, $SnO_2$, SiAlN, or ZnSn. Moreover, a substrate may be made of a material such as glass. Magnetic fluid layer 208 may include magnetite, hematite, or some other compound containing iron.

Figure 3:
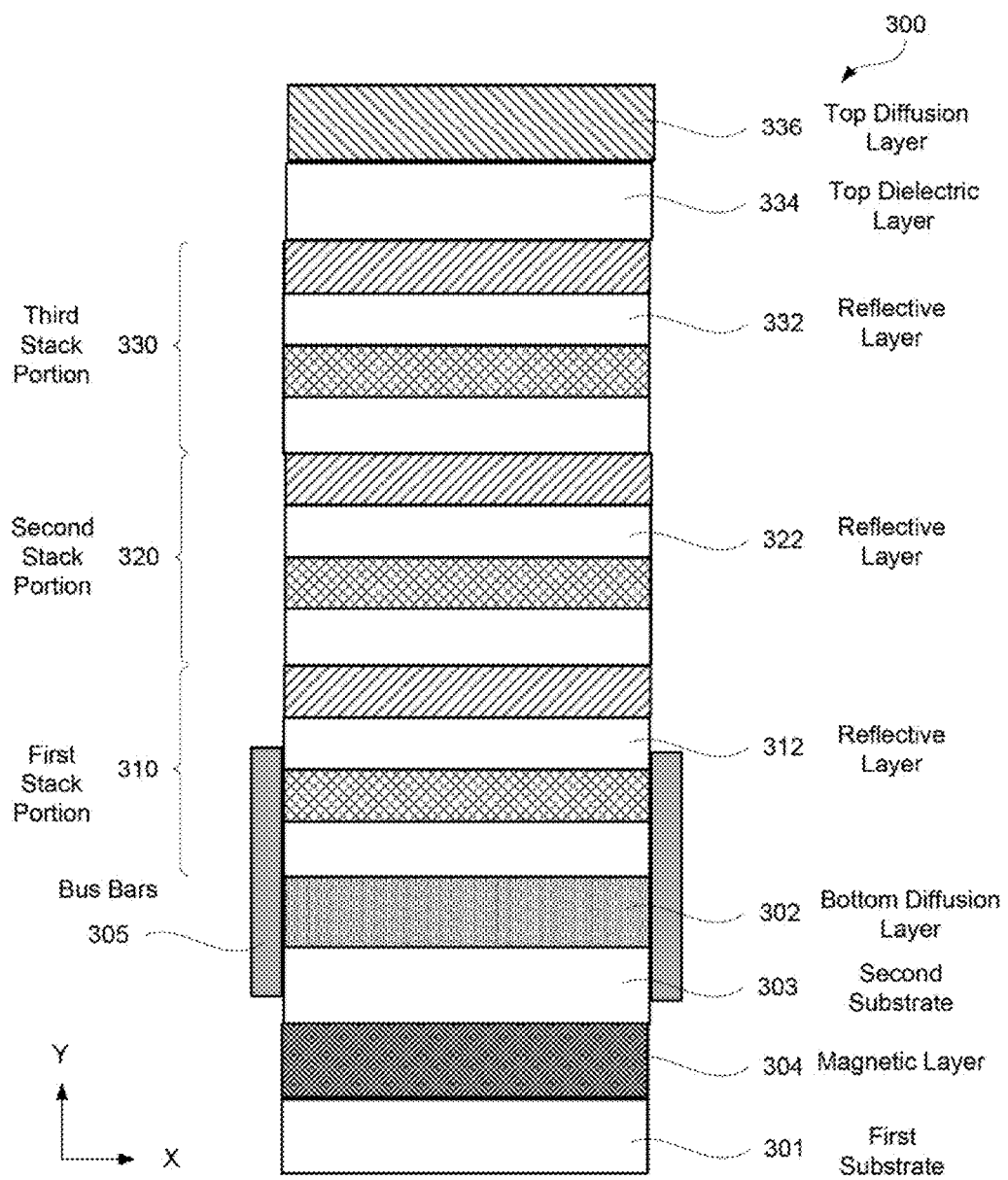
FIG. 3 is a schematic illustration of yet another article including a substrate and a stack of layers including three reflective layers formed over the substrate, in accordance with some embodiments.

FIG. 3 is a schematic illustration of yet another article 300 including first substrate 301, second substrate 303, magnetic layer 304, bus bars 305, and three reflective layers, each being a part of as separate stack portion. Specifically, article 300 includes first stack portion 310 having reflective layer 312, second stack portion 320 having reflective layer 322, and third stack portion 330 having reflective layer 332. Other layers of article 300 also bottom diffusion layer 302, top dielectric layer 334, and top diffusion layer 336. As similarly discussed above with reference to FIG. 1 and FIG. 2, a reflective layer, such as reflective layer 312, may include silver. Moreover, a seed layer may include a metal oxide, as previously discussed with reference to seed layer 108 of FIG. 1, such as zinc oxide, titanium oxide, or tin oxide. A barrier layer may include a partially oxidized alloy of at least nickel, titanium, and niobium. Furthermore a dielectric layer may include $TiO_2$, ZnO, $SnO_2$, SiAlN, or ZnSn. Moreover, a substrate may be made of a material such as glass. Magnetic fluid layer 304 may include magnetite, hematite, or some other compound containing iron.

Processing Examples

Figure 4:
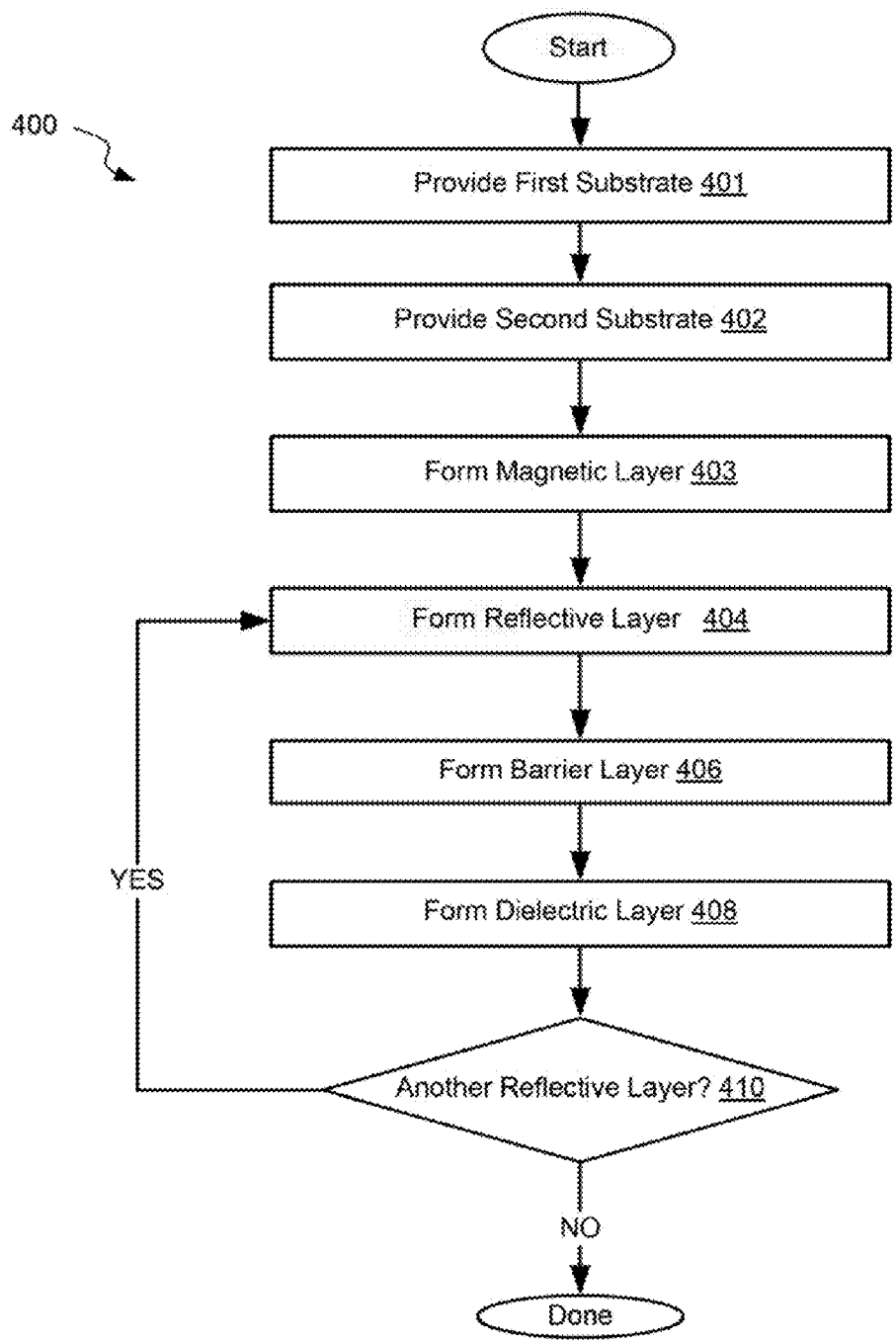
FIG. 4 is a process flowchart corresponding to a method for forming an article including a reflective layer and a barrier layer for protecting materials in this reflective layer from oxidation, in accordance with some embodiments.

FIG. 4 is a process flowchart corresponding to a method 400 of forming an article including a silver reflective layer and a barrier layer for protecting this reflective layer from oxidation, in accordance with some embodiments. Method 400 may commence with providing a first substrate during operation 401. As similarly discussed above with reference to FIG. 1, FIG. 2, and FIG. 3, a substrate may be made of a transparent material such as glass.

Method 400 may proceed with providing a second substrate during operation 402. In some embodiments, the provided second substrate is a glass substrate. The second substrate may include one or more previous deposited layers. For example, the second substrate may include a bottom diffusion layer, a bottom dielectric layer, and a seed layer. In some embodiments, one of more of these layers may not be present on the second substrate. Various examples of these layers and substrates are described above with reference to FIG. 1. Furthermore, second substrate may also include bus bars configured to be coupled to an external voltage source.

Method 400 may proceed with forming a magnetic layer during operation 403. As similarly discussed above, the first substrate and the second substrate may define a cavity or space. During operation 403, the space may be filled with a magnetic fluid to create a magnetic layer. In some embodiments, instead of filling the cavity with fluid, it may be filled with capsules, as discussed above with reference to FIG. 1. In this example, operation 403 may be performed before operation 402, and the capsules may be deposited on a surface of the first substrate or the second substrate. In some embodiments, operation 403 may be performed after operation 408 discussed below, and capsules may be deposited on top of another layer, such as a top dielectric layer or a top diffusion layer.

Method 400 may proceed with forming a reflective layer over the substrate during operation 404 or, more specifically, over one or more layers previously formed on the provided substrate. This operation may involve sputtering silver in a non-reactive environment. The silver barrier layer was deposited in argon environment at a pressure of 2 millitorr using 90 W power. The resulting deposition rate may be about 2.9 Angstroms per second. The target to substrate spacing may be about 240 millimeters. The thickness of the reflective layer may be between about 150 Angstroms and 400 Angstroms. As similarly discussed above, one or more portions of the reflective layer may be formed over the bus bars, thus providing an electrical connection between the reflective layer and an external voltage source.

Method 400 may proceed with forming a barrier layer over the reflective layer during operation 406. As noted above, the barrier layer may be formed from an alloy including one or more of nickel, chromium, titanium, niobium, and aluminum that is formed by co-sputtering of these metals in a non-reactive environment. In some embodiments, the barrier layer is deposited in the same processing chamber as the reflective layer without breaking the vacuum in the chamber. Overall, the reflective layer needs to be protected from oxygen prior to deposition of the barrier layer. In some embodiments, a partially fabricated article may be maintained in an oxygen-free environment after forming the reflective layer and prior to forming the barrier layer.

Method 400 may then proceed with forming a dielectric layer over the barrier layer during operation 408. This operation may involve sputtering titanium or tin in an oxygen containing environment. During this operation, the barrier layer prevents oxygen in the oxygen containing environment from reaching and reacting with metallic silver in the reflective layer.

If another reflective layer needs to be deposited on the substrate, operations 404-408 may be repeated as indicated by decision block 410.

Operating Examples

Figure 5:
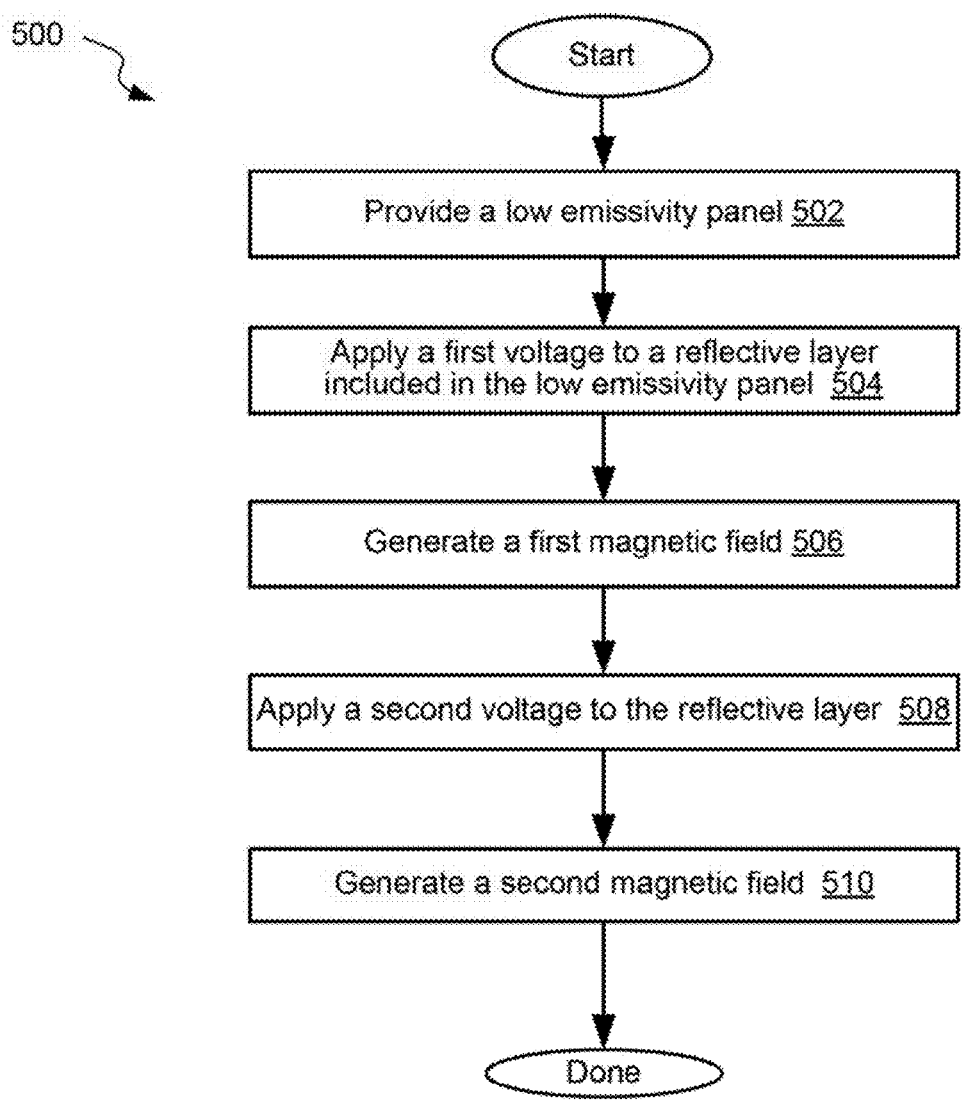
FIG. 5 is a process flowchart corresponding to a method of operating a low emissivity panel, in accordance with some embodiments.

FIG. 5 is a process flowchart corresponding to a method of operating a low emissivity panel, in accordance with some embodiments. Method 500 may reversibly alter or change the transmissivity of low emissivity panels, as disclosed herein. Accordingly, method 500 may commence with providing a low emissivity panel during operation 502. As similarly discussed above, the low emissivity panel may include a first substrate, a magnetic fluid layer deposited on a first surface of the first substrate. The low emissivity panel may also include a reflective layer deposited on a second surface of the first substrate. As similarly discussed above with reference to FIG. 1, the magnetic fluid layer may include magnetic particles that may be suspended in a fluid. The magnetic fluid may be encapsulated in capsules. Furthermore, the reflective layer may be made of a material that is electrically conductive, such as silver.

Method 500 may proceed with applying a first voltage to the reflective layer during operation 504. An external power or voltage source may be electronically coupled to the reflective layer. In some embodiments, the voltage source is coupled to the reflective layer via electrical leads such that the first voltage is applied between two opposite edges of the reflective layer. The voltage source may have an amplitude of between about 5 V to 18 V direct current (DC).

Method 500 may proceed with generating a first magnetic field during operation 506. In some embodiments, the application of the first voltage to the reflective layer generates a first electrical current that is passed through the reflective layer. In some embodiments, the current density passed through the reflective layer may range from between about 0.1 mA/μm$^2$ and 10 mA/μm$^2$. The passage of the first electrical current through the reflective layer may generate a first magnetic field. In some embodiments, the amplitude of the first magnetic field is sufficient to affect an orientation of magnetic particles in the magnetic layer. Thus, the first magnetic field may change an orientation of the magnetic particles in the magnetic fluid layer, and consequently change a transmissivity of the magnetic fluid layer within a visible spectrum. In this way, applying the first voltage may change a transmissivity of the low emissivity panel. In some embodiments, applying the first voltage to the reflective layer changes the transmissivity of the low emissivity panel by at least 25%.

Method 500 may proceed with applying a second voltage to the reflective layer during operation 508. The application of the second voltage may further change the transmissivity of the low emissivity panel. In some embodiments, the second voltage is about 0 V and the transmissivity of the low emissivity panel returns to an original state due, at least in part, to Van der Waals forces. In some embodiments, the first voltage may have an amplitude that is the same as the first voltage, but may have an opposite or reverse polarity relative to the first voltage. In this example, the application of the second voltage may generate a second electrical current that is equal in amplitude to the first electrical current, but opposite in direction/polarity.

Method 500 may proceed with generating a second magnetic field during operation 510. In some embodiments, the passage of the second electrical current through the reflective layer may generate a second magnetic field which may affect an orientation of the magnetic particles in the magnetic fluid layer. In this way, the second magnetic field may reverse or counteract the change in orientation of the magnetic particles caused by the first magnetic field. In some embodiments, the application of the second voltage may return the transmissivity of the low emissivity panel to its original state. In some embodiments, applying the second voltage changes the transmissivity of the low emissivity panel in a different wavelength region relative to the first voltage. It will be appreciated that when the amplitude of the second voltage is about 0V, operation 510 need not be performed because no second electrical current is passed through the reflective layer.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A low emissivity panel comprising:
   a first substrate,
      the first substrate having a first side and a second side;
   a magnetic fluid layer deposited over the first side of the first substrate; and
   a reflective layer deposited over the second side of the first substrate,
      the magnetic fluid layer comprising magnetic particles,
      the reflective layer comprising a conductive material configured to conduct an electrical current and generate a magnetic field,
      wherein the magnetic field is configured to change an orientation of the magnetic particles in the magnetic fluid layer and a transmissivity of the magnetic fluid layer within a visible spectrum.

2. The low emissivity panel of claim 1, further comprising a first bus and a second bus, the first bus and the second bus deposited along opposite edges of the reflective layer and electrically connected to the reflective layer, wherein applying a voltage between the first bus and the second bus generates the electrical current through the reflective layer.

3. The low emissivity panel of claim 1, wherein the conductive material of the reflective layer comprises one of silver or aluminum.

4. The low emissivity panel of claim 1, wherein the reflective layer has a thickness of between about 10 nm and 40 nm.

5. The low emissivity panel of claim 1, wherein the first substrate comprises glass and has a thickness of between about 1 mm and 20 mm.

6. The low emissivity panel of claim 1, further comprising a second substrate, wherein the magnetic fluid layer is deposited between the first substrate and the second substrate.

7. The low emissivity panel of claim 6, wherein the second substrate is attached to the first substrate along edges of the first substrate and the second substrate.

8. The low emissivity panel of claim 1, wherein the magnetic particles comprise one of magnetite or hematite.

9. The low emissivity panel of claim 1, wherein the magnetic particles comprise a surfactant, the surfactant comprising one of oleic acid, tetra-methyl ammonium hydroxide, citric acid, or soy lecithin.

10. The low emissivity panel of claim 1, wherein the magnetic fluid layer comprises a plurality of capsules, each of the plurality of capsules comprising a portion of the magnetic particles suspended in a carrier fluid, wherein the plurality of capsules is adhered to the first side of the first substrate.

11. The low emissivity panel of claim 1, wherein the low emissivity panel is configured to change a transmissivity by at least about 25% when the current is passed through the reflective layer.

12. The low emissivity panel of claim 1, wherein the low emissivity panel is configured to apply different voltages at different locations along opposite edges of the reflective layer.

13. A method of operating a low emissivity panel, the method comprising:
   providing the low emissivity panel comprising a first substrate, a magnetic fluid layer deposited on a first surface of the first substrate, and a reflective layer deposited on a second surface of the first substrate, the magnetic fluid layer comprising magnetic particles, the reflective layer comprising a conductive material; and
   applying a first voltage to the reflective layer between two opposite edges of the reflective layer, wherein applying the first voltage changes a transmissivity of the low emissivity panel.

14. The method of claim 13, wherein applying the first voltage generates an electrical current that passes through the reflective layer and creates a magnetic field, the magnetic field changing an orientation of the magnetic particles in the magnetic fluid layer, wherein a change in the orientation of the magnetic particles in the magnetic fluid layer changes a transmissivity of the magnetic fluid layer within a visible spectrum.

15. The method of claim 13, wherein applying the first voltage to the reflective layer changes the transmissivity of the low emissivity panel by at least 25%.

16. The method of claim 13, further comprising applying a second voltage to the reflective layer, wherein applying the second voltage further changes the transmissivity of the low emissivity panel.

17. The method of claim 16, wherein the second voltage is about 0 V and the transmissivity of the low emissivity panel returns to an original state.

18. The method of claim 16, wherein the second voltage has a reverse polarity relative to the first voltage.

19. The method of claim 16, wherein applying the second voltage changes the transmissivity of the low emissivity panel in a different wavelength region relative to the first voltage.

20. The method of claim 13, wherein a current density passed through the reflective layer ranges from between about 0.1 mA/$\mu$m$^2$ and 10 mA/$\mu$m$^2$.

* * * * *